(12) United States Patent
Shu et al.

(10) Patent No.: US 12,394,979 B2
(45) Date of Patent: Aug. 19, 2025

(54) METHOD AND SYSTEM FOR ADAPTIVE SINGLE-PHASE RECLOSING OF WIND FARM AC TRANSMISSION LINES

(71) Applicant: KUNMING UNIVERSITY OF SCIENCE AND TECHNOLOGY, Kunming (CN)

(72) Inventors: Hongchun Shu, Kunming (CN); Yue Dai, Kunming (CN); Cong Li, Kunming (CN); Yutao Tang, Kunming (CN); Hongfang Zhao, Kunming (CN); Yiming Han, Kunming (CN); Kaiqing Tian, Kunming (CN); Jun Dong, Kunming (CN)

(73) Assignee: KUNMING UNIVERSITY OF SCIENCE AND TECHNOLOGY

( * ) Notice: Subject to any disclaimer, the term of this patent is extended or adjusted under 35 U.S.C. 154(b) by 0 days.

(21) Appl. No.: 18/945,578

(22) Filed: Nov. 13, 2024

(65) Prior Publication Data
US 2025/0158401 A1    May 15, 2025

(30) Foreign Application Priority Data
Nov. 14, 2023  (CN) .......................... 202311507174.2

(51) Int. Cl.
*H02J 3/00*    (2006.01)
*G01R 31/52*   (2020.01)
(Continued)

(52) U.S. Cl.
CPC ........ *H02J 3/0012* (2020.01); *H02J 3/00125* (2020.01); *H02J 3/381* (2013.01);
(Continued)

(58) Field of Classification Search
CPC ...... H02J 3/0012; H02J 3/00125; H02J 3/381; H02J 13/0004; H02J 2203/20; H02J 2300/28; G01R 31/52
See application file for complete search history.

(56) References Cited

U.S. PATENT DOCUMENTS

| | | | | |
|---|---|---|---|---|
| 4,256,972 A | * | 3/1981 | Wyatt ...................... | H02J 3/42 307/68 |
| 2003/0011348 A1 | * | 1/2003 | Lof .......................... | H02J 3/48 322/37 |

(Continued)

*Primary Examiner* — Ziaul Karim

(57) ABSTRACT

This invention relates to a method and system for adaptive reclosing of single-phase AC transmission lines in wind power systems. The invention utilizes single-ended electrical quantity to determine the type of fault. After a fault occurs, a signal acquisition device is used to sample the voltage of the fault phase. The obtained voltage is subjected to short-time Fourier transform to extract the amplitude of the fundamental frequency voltage component, and then processed with differential amplification to construct a fault nature identification criterion. Combined with a sliding time window for fault identification, if it is identified as a permanent fault, the reclosing device is locked out; if it is identified as a transient fault, the fault disappearance time is calculated to determine the reclosing time and output the closing signal. This invention is designed for adaptive reclosing after a circuit breaker trips in wind power AC transmission lines.

8 Claims, 11 Drawing Sheets

(51) Int. Cl.
*H02J 3/38* (2006.01)
*H02J 13/00* (2006.01)

(52) U.S. Cl.
CPC .......... *H02J 13/0004* (2020.01); *G01R 31/52* (2020.01); *H02J 2203/20* (2020.01); *H02J 2300/28* (2020.01)

(56) References Cited

U.S. PATENT DOCUMENTS

| | | | |
|---|---|---|---|
| 2004/0145188 A1* | 7/2004 | Janssen | F03D 7/0284 |
| | | | 290/44 |
| 2005/0122083 A1* | 6/2005 | Erdman | F03D 9/25 |
| | | | 322/20 |
| 2010/0292852 A1* | 11/2010 | Gertmar | H02J 3/40 |
| | | | 290/44 |
| 2011/0103110 A1* | 5/2011 | Godridge | H02J 3/381 |
| | | | 363/74 |
| 2015/0073610 A1* | 3/2015 | Schnetzka | G05B 15/02 |
| | | | 700/287 |
| 2016/0239010 A1* | 8/2016 | McDaniel | H02J 13/00002 |
| 2017/0356965 A1* | 12/2017 | Guzman-Casillas | G01R 31/42 |
| 2021/0124854 A1* | 4/2021 | Wang | G06F 30/18 |
| 2021/0293873 A1* | 9/2021 | Sun | G01R 31/085 |
| 2022/0128613 A1* | 4/2022 | Baeckeland | H02H 3/40 |
| 2022/0155386 A1* | 5/2022 | Athikessavan | G01R 31/52 |
| 2022/0206055 A1* | 6/2022 | Verrax | G01R 31/086 |

* cited by examiner

METHOD AND SYSTEM FOR ADAPTIVE SINGLE-PHASE RECLOSING OF WIND FARM AC TRANSMISSION LINES

TECHNICAL FIELD

This invention relates to a method and system for adaptive single-phase auto-reclosing of wind farm AC transmission lines, which falls within the field of relay protection in power systems.

BACKGROUND OF THE INVENTION

In recent years, the wind power industry in China has developed rapidly. With the continuous construction of wind power transmission projects and the continuous commissioning of wind turbine units, the wind power system has become more and more complex. The impact of faults in wind power transmission lines on the wind power system and the power grid has also become more serious. According to relevant statistics, the majority of faults occurring in wind power AC transmission lines are single-phase grounding transient faults. After the fault disappears, the circuit breaker of the fault phase can be reclosed to restore power supply, hence the widespread application of auto-reclosing technology. However, the automatic reclosing devices of wind power AC transmission lines currently mostly adopt blind reclosing methods, lacking selectivity. When the circuit breaker of the AC transmission line is reclosed on a permanent fault, it will impact the electrical equipment and affect the safe and stable operation of the power grid. The harm is even more serious than when a short circuit fault occurs in the line. Therefore, it is necessary to identify the nature of the fault before the circuit breaker reclosing. If identified as a permanent fault, calculate the fault disappearance time, and after the arc channel insulation recovery time, perform the reclosing operation to restore the system power supply; if judged as a permanent fault, lock out the circuit breaker to prevent the reclosing from causing a secondary impact on the system. Currently, adaptive auto-reclosing technology has attracted the attention of many scholars and experts. Some scholars, based on the first arc stage from the fault occurrence time to the fault phase tripping, list the voltage equations of each sequence network according to the fundamental frequency current and voltage and the third harmonic component of the fault phase, and solve for the arc resistance or arc voltage to identify the fault nature. However, this method can only identify the fault nature and cannot calculate the disappearance time of the transient fault. Some scholars have proposed using the percentage of odd harmonic energy of the fault phase terminal voltage to the total harmonic energy to identify the fault nature, and use the amplitude ratio of the third harmonic to the fundamental wave to identify the disappearance time of the transient fault. However, due to the difficulty for the voltage transformer to accurately extract the third harmonic component, it affects the calculation accuracy of the fault disappearance time. Some scholars have also proposed identifying the fault nature based on the phase angle difference of the voltage at both ends of the fault phase after the fault occurs, but it requires measuring devices to be installed on both sides of the line, and due to the frequency offset characteristics of the wind farm system, it may affect the result of fault nature identification. The above methods have problems such as inability to determine the specific closing time, poor calculation accuracy, lack of universality, and high transformation cost.

DESCRIPTION OF THE INVENTION

In view of the above, this invention provides a method and system for adaptive auto-reclosing of wind power AC transmission lines, which does not require signal injection or additional devices. It can identify the nature of the fault by simply detecting whether the amplitude of the fundamental frequency voltage of the fault phase shifts after the circuit breaker trips, and has high universality and accuracy.

When a single-phase ground fault occurs in the wind power AC transmission line, the line protection acts, and the circuit breakers at both ends of the fault phase trip simultaneously, and the wind power AC transmission line operates in an incomplete phase state. At this time, due to the capacitive coupling and electromagnetic coupling between the healthy phase and the fault phase, the fundamental frequency voltage of the fault phase is not zero. When a permanent single-phase ground fault occurs in the wind power AC transmission line, the line is reliably grounded, and the capacitance discharges stably to the ground, causing the capacitive coupling voltage on the fault phase to approach zero. At this time, the fundamental frequency voltage of the fault phase is mainly the inductive coupling voltage; when a transient single-phase ground fault occurs in the wind power AC transmission line, the fundamental frequency voltage of the fault phase before the secondary arc extinguishes is close to that of the permanent fault. After the secondary arc of the transient fault extinguishes, the fault point disappears, and the fundamental frequency voltage of the fault phase is mainly capacitive coupling voltage and inductive coupling voltage, and at this time, the fundamental frequency voltage of the fault phase will shift significantly. Therefore, by detecting whether the fundamental frequency voltage of the fault phase shifts after the circuit breaker trips, the nature of the fault can be identified. This invention adopts the following technical scheme:

A single-phase adaptive reclosing method and system for wind power AC transmission line, and the specific steps are as follows:

Step1: Sample the fault phase using a signal acquisition device. The implementation method of this step is to install a voltage transformer at the measurement end on the wind farm side of the outgoing line. When a fault occurs in the outgoing line, sample the voltage of the fault phase.

Step2: Subject the obtained fault phase voltage to short-time Fourier transform to extract the fundamental frequency voltage component amplitude $U_f(k)$. Specifically:

Step2.1: Define a sliding time window $T_{s1}$ with a sampling window length and a sliding factor both of 20 ms. The basis for performing this step is that the sampling data window of the full cycle Fourier algorithm is one fundamental frequency period, i.e., 20 ms.

Step2.2: Subject the collected fault phase voltage to short-time Fourier transform within each sliding time window $T_{s1}$ to extract the fundamental frequency voltage component amplitude $U_f(k)$. The advantage of performing this step is that after the transient fault disappears, the fundamental frequency voltage includes electromagnetic coupling voltage and capacitive coupling voltage, while the fundamental frequency voltage component of the permanent fault is mainly electromagnetic coupling voltage, which can identify the nature of the fault by analyzing the characteristics of the fundamental frequency voltage component.

Step3: Subject the obtained fundamental frequency voltage component amplitude of the fault phase to differential amplification processing to obtain $U_d(k)$. Specifically:

Step3.1: Define a sliding time window $T_{s2}$ with a sampling window length of a and a sliding factor of b. The advantage of performing this step is that differential amplification processing is performed after short-time Fourier transform, which is to analyze the real-time changes of fault information over time, hence the length of $T_{s2}$ should be less than Ti, and the smaller the sliding factor, the smaller the detection result error.

Step3.2: Subject the fundamental frequency voltage component amplitude $U_f(k)$ to j times differential amplification processing within each sliding time window $T_{s2}$. The advantage of performing this step is that after the circuit breaker trips on both sides of the fault phase, the voltage on the fault phase is only maintained by the electromagnetic coupling and capacitive coupling between the healthy phase and the fault phase, and its value is small. Differential transformation is performed to amplify the difference between the fundamental frequency voltage component amplitude before and after the disappearance of the transient fault. The formula is as follows:

$$U_{di}(k) = [U_{fi}(k+1) - U_{fi}(k)]^j, k = 1, 2, \ldots, N$$

Where i represents the i-th sliding time window $T_{s2}$, and N represents the number of sampling points contained in a sampling time window.

Step4: Calculate the maximum discrimination time limit and construct a fault nature identification criterion. Specifically:

Step4.1: Set the maximum discrimination time limit $t_{max}$ to 470 ms. The basis for performing this step is that according to the operating experience of China's power grid, the fixed time for automatic reclosing is 0.6 s to 1.5 s. Here, 0.7 s is taken. About 100 ms after the fault occurs, the circuit breaker opens. After the fault disappears, the arc channel's insulation recovery requires a certain amount of time. The arc channel's insulation recovery time is taken as 100 ms, and after the fault phase circuit breaker opens, to prevent the transient overvoltage caused by tripping from interfering with the accuracy of the criterion, the Arc extinguishing detection starts 30 ms after the tripping. Therefore, the maximum discrimination time limit detection time window is set to 470 ms.

Step4.2: Construct a fault nature identification criterion: if within a certain time window $U_{di}(m) > \varepsilon$, then it is judged as a transient fault, otherwise it is judged as a permanent fault. The advantage of performing this step is that when a transient fault occurs, there will be a significant mutation in the fundamental frequency component amplitude of the fault phase after differential transformation before and after the fault disappears, while when a permanent fault occurs, there is no mutation in the fundamental frequency component amplitude of the fault phase after differential transformation, and its value remains stable close to zero. To retain a margin, $\varepsilon$ is set to 1 here.

Step5: Within the maximum discrimination time limit $t_{max}$, use each sliding time window $T_{s2}$ for fault nature identification. If judged as a permanent fault, lock out the reclosing device; if judged as a transient fault, proceed to Step 6. The advantage is that after the maximum discrimination time limit has passed and no obvious mutation point is detected, it is identified as a permanent fault, and a lockout signal is output to prevent the fault nature identification system from continuously detecting.

Step6: Calculate the fault disappearance time $t_d$, and determine the reclosing time $t_c$ through the fault disappearance time. Specifically:

Step6.1: According to the sliding times i of the sampling time window $T_{s2}$ obtained in Step 4.2, the abrupt sampling point m and the relevant action time of the circuit breaker, the fault disappearance time $t_d$ was calculated. The basis for performing this step is that after the fault occurs, the circuit breaker is disconnected at the time to and after the fault phase circuit breaker is disconnected, in order to prevent the transient overvoltage interference criterion accuracy caused by tripping, the signal after 30 ms of tripping begins to be detected by arc extinguishing. It is calculated as follows:

$$t_d = m \cdot T_c + i + t_o + 30$$

where $T_c$ is the interval between two adjacent sampling points, and is calculated as follows:

$$T_c = \frac{1}{f_s}$$

where $f_s$ is the signal sampling frequency.

Step6.2: The calculated fault disappearance time $t_d$ is used to determine the reclosing time $t_c$ in combination with the arc insulation recovery time, and the closing signal is output. The basis for performing this step is that after the fault disappears, it takes a certain amount of time for the insulation of the arc to be restored, and the insulation recovery time of the arc is 100 ms. It is calculated as follows:

$$t_c = t_d + 100$$

A system for adaptive single-phase auto-reclosing of wind power AC transmission lines, characterized by including:

A signal acquisition module, used to obtain voltage data of the fault phase at the protection installation on the wind farm side after a fault occurs;

A numerical calculation module, used to perform short-time Fourier transform on the obtained fault phase voltage data, extract the fundamental frequency amplitude voltage component amplitude, and perform differential amplification processing;

A fault judgment module or fault determination module, used to construct a fault nature identification criterion, combine a sliding time window to determine the fault nature within the maximum discrimination time limit, and output the determination result;

A closing control module, used to receive the output signal from the fault judgment module and control the circuit breaker to take corresponding actions.

The single-phase adaptive reclosing system of the wind power alternating current transmission line, wherein the signal acquisition module specifically comprises:

A data acquisition unit: used to collect analog voltage quantities of the fault phase at the protection installation on the wind farm side;

An analog-to-digital conversion unit: used to convert the obtained voltage analog quantity into a digital quantity.

The single-phase adaptive reclosing system of the wind power alternating current transmission line, wherein the numerical calculation module specifically comprises:

Power frequency extraction unit: used for short-term Fourier transform of the obtained fault phase voltage data to extract the power frequency amplitude voltage component amplitude;

Differential amplification unit: It is used for differential amplification of the amplitude of the power frequency voltage component.

The single-phase adaptive reclosing system of the wind power AC transmission line, wherein the fault judgment module specifically comprises:

A time limit setting unit: used to set the maximum discrimination time limit and determine the sampling window length;

A fault discrimination unit: used to construct a fault nature identification criterion, combine a sliding time window to determine the fault nature within the maximum discrimination time limit, if judged as a permanent fault, output a lockout signal; if judged as a transient fault, output a closing signal.

The single-phase adaptive reclosing system of the wind power alternating current transmission line, wherein the closing control module specifically comprises:

A lockout control unit: used to receive the circuit breaker lockout signal and control the circuit breaker not to act;

A closing control unit: used to receive the circuit breaker closing signal, after a fixed deionization time, control the circuit breaker to reclose.

The beneficial effects of the present invention are:

The invention identifies the nature of the fault by detecting whether the amplitude of the power frequency voltage component of the fault phase is offset after the wind power AC transmission circuit breaker trips, and the criterion is simple and easy to realize;

The present invention takes the moment when the amplitude of the power frequency voltage component of the fault phase of the wind power AC transmission line occurs abruptly as the time when the fault disappears, and the error is small, and the closing time of the circuit breaker is reasonably calculated, and the system recovery power supply speed is greatly improved;

The present invention does not need to actively inject signal, does not need to add additional device, and the cost is lower;

The present invention has been verified by a large number of simulations, is less affected by the transition resistance, and has good robustness.

DETAILED DESCRIPTION OF THE INVENTION

Below, the specific implementations of the invention are further illustrated in conjunction with the drawings and specific examples.

Figure 1:
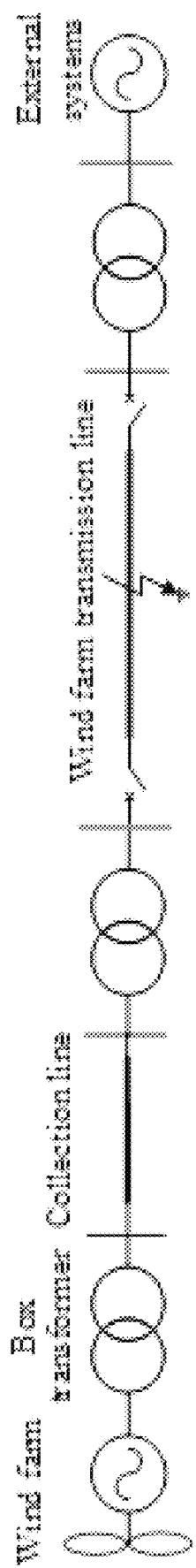
FIG. 1 is a topological diagram of the simulation model of this invention.

Example 1: The wind power AC transmission line simulation model system is shown in FIG. 1. There are no shunt reactors installed on both sides of the AC transmission line, the line length is 100 km, and the voltage level is 220 kV. A fault is set to occur 30 km away from the wind farm, the fault type is a single-phase ground transient fault on phase A. The circuit breaker trips after 95.55 ms from the fault occurrence, the fault duration is 250 ms, the transition resistance is 0.01Ω, and the sampling rate is 20 kHz.

Figure 2:
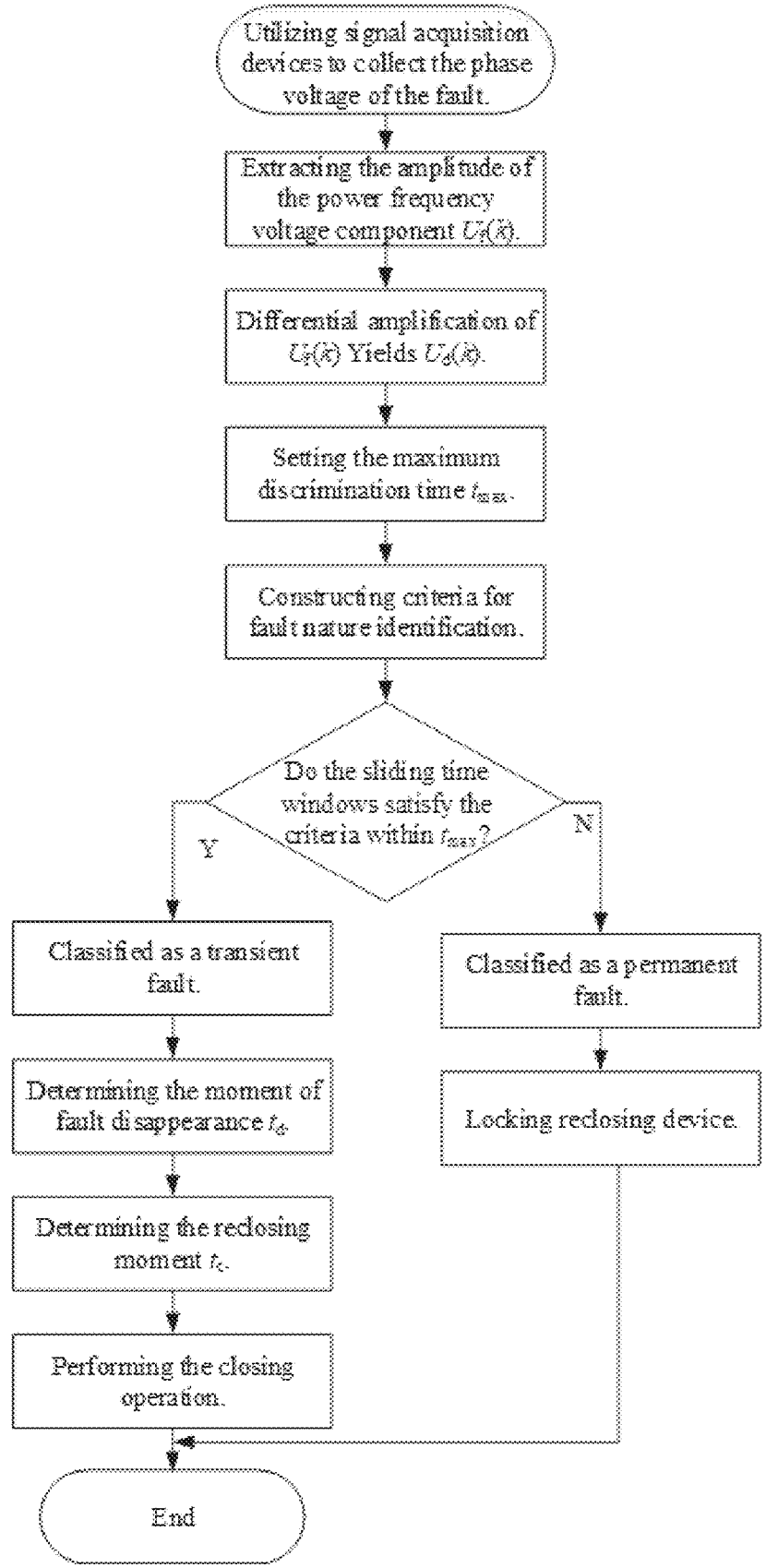
FIG. 2 is a flowchart of the adaptive reclosing of this invention.
Figure 4:
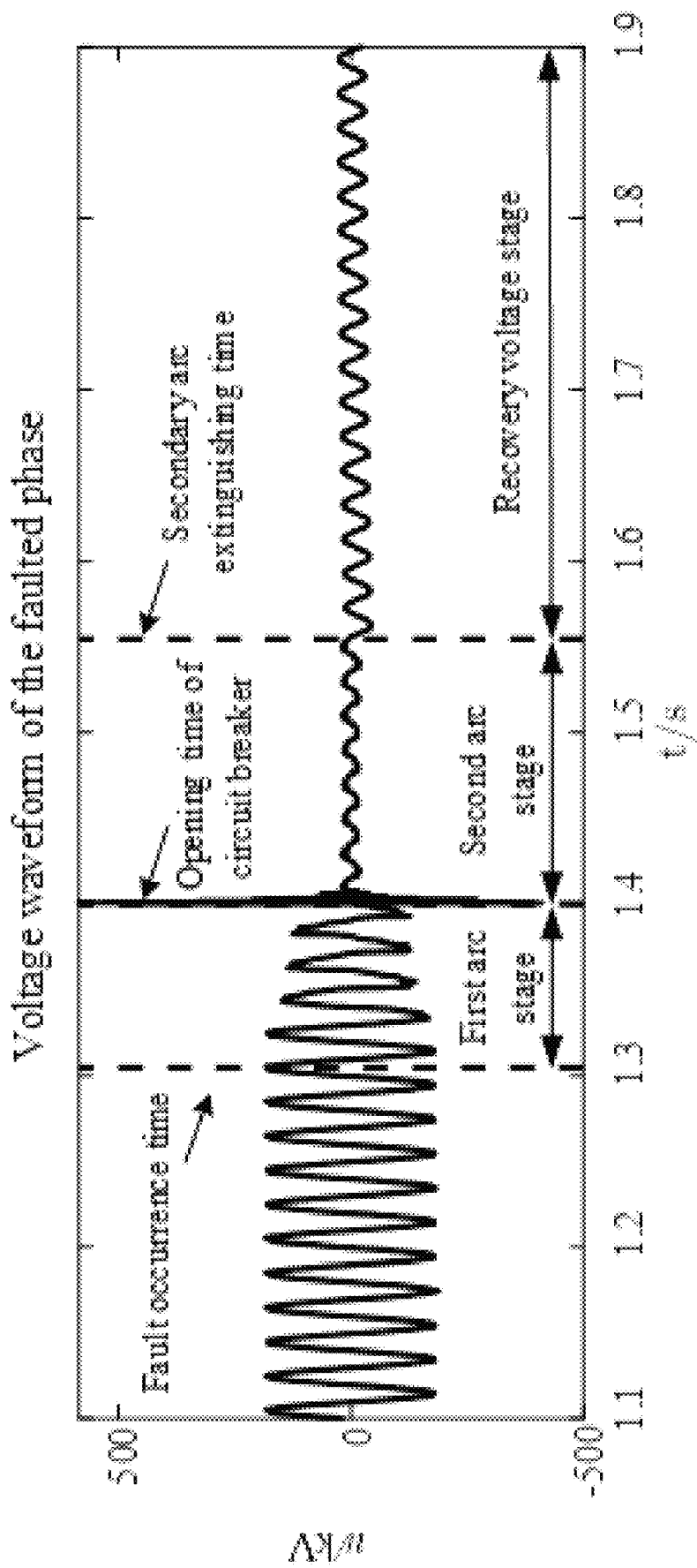
FIG. 4 is a waveform diagram of the fault phase voltage in example 1 of this invention.

An adaptive single-phase auto-reclosing method for wind power AC transmission lines is specifically shown in FIG. 2 and includes the following steps:

Step1: Sample the fault phase voltage using a signal acquisition device;

Step1.1: Install a voltage signal acquisition device on the wind farm side of the outgoing line;

Step1.2: After a single-phase ground fault occurs in the wind farm outgoing line, use the signal acquisition device to sample the fault phase voltage, as shown in FIG. 4.

Figure 5:
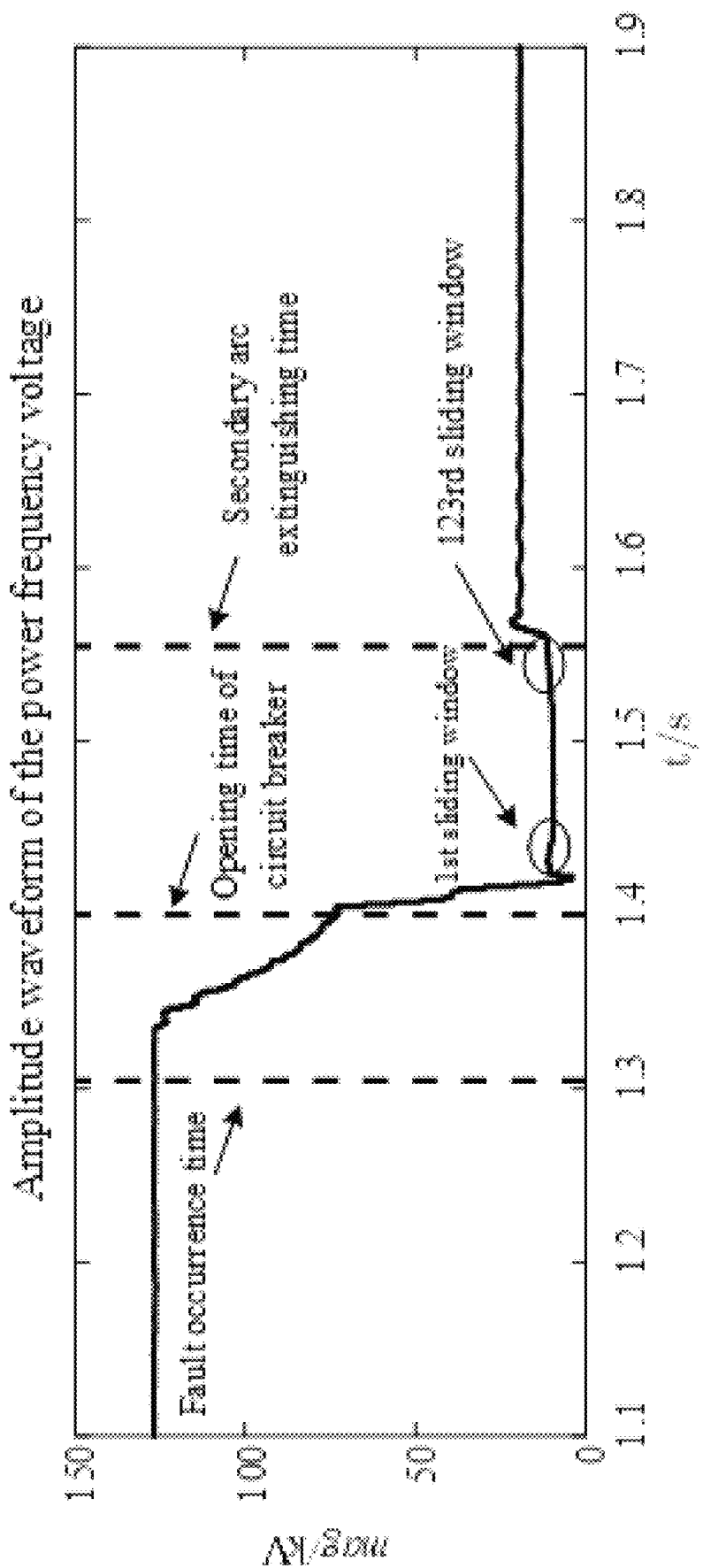
FIG. 5 is a waveform diagram of the fundamental frequency voltage component amplitude of the fault phase in example 1 of this invention.

Step2: Subject the obtained fault phase voltage to short-time Fourier transform to extract the fundamental frequency voltage component amplitude $U_f(k)$;

Step2.1: Define a sliding time window $T_{s1}$ with a sampling window length and a sliding factor both of 20 ms;

Step2.2: Subject the collected fault phase voltage to short-time Fourier transform within each sliding time window $T_{s1}$ to extract the fundamental frequency voltage component amplitude $U_f(k)$, where k represents the current sampling point, as shown in FIG. 5.

Step3: Subject the obtained fundamental frequency voltage component amplitude of the fault phase to differential amplification processing to obtain $U_d(k)$;

Step3.1: Define a sliding time window $T_{s2}$ with a sampling window length of a and a sliding factor of b. In this example, a is set to 10 ms and b is set to 1 ms.

Step3.2: In each sliding time window $T_{s2}$, the amplitude of the power frequency voltage component $U_f(k)$ is differentially amplified j times.

$$U_{di}(k) = [U_{fi}(k+1) - U_{fi}(k)]^j, k = 1, 2, \ldots, N$$

where i represents the i-th sliding time window $T_{s2}$, and N represents the number of sampling points contained in a sampling time window. In this embodiment, j takes 3 and N takes 200.

Step4: Calculate the maximum discrimination time limit and construct a fault nature identification criterion;

Step4.1: Set the maximum discrimination time limit $t_{max}$ to 470 ms. In this example, the sliding time window $T_{s2}$ is 10 ms and the sliding factor is 1 ms. According to the maximum discrimination time limit, the maximum number of sliding times i is calculated to be 461.

Step4.2: Construct a fault nature identification criterion: if within a certain time window $U_{di}(m)>1$, then it is judged as a transient fault, otherwise it is judged as a permanent fault.

Figure 6:
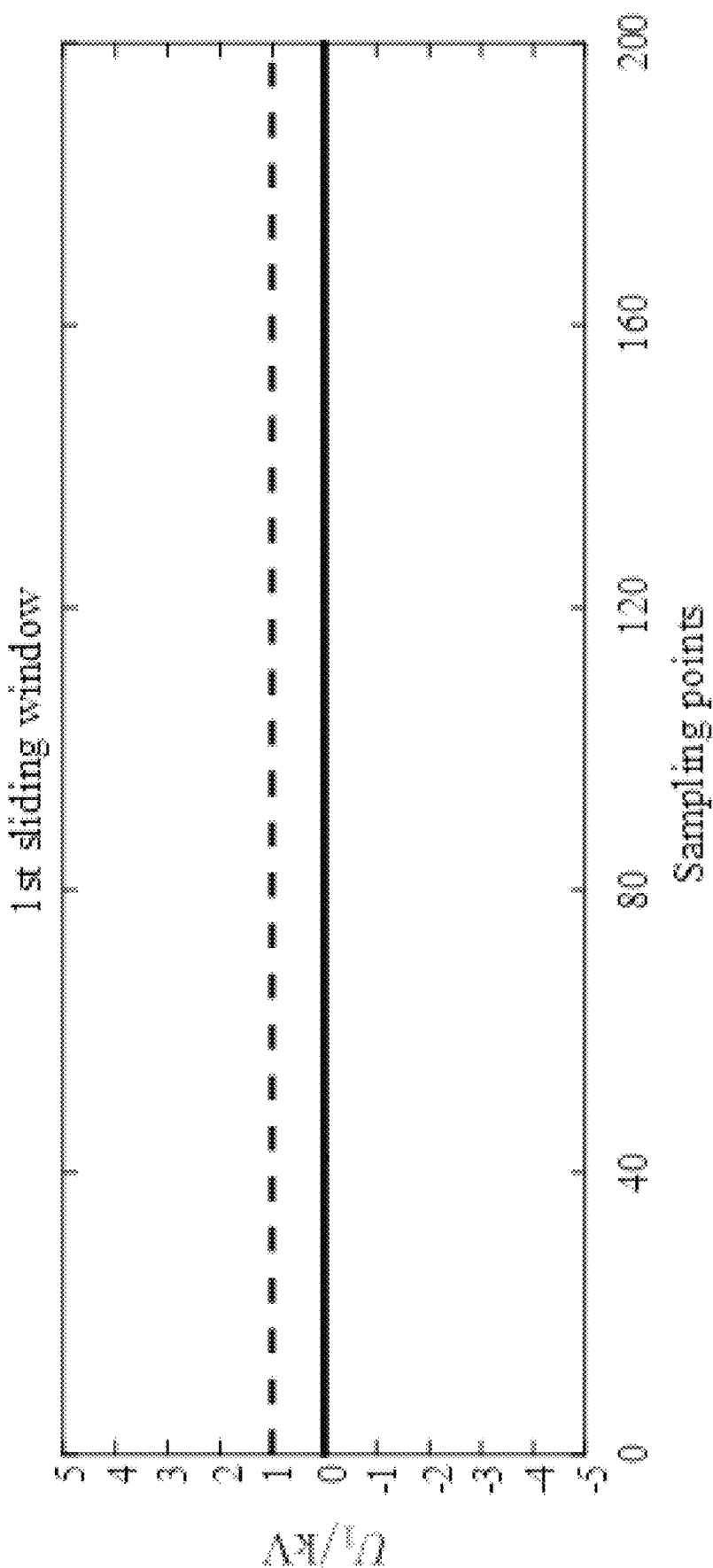
FIG. 6 is a schematic diagram of the first sliding window for fault nature identification in example 1 of this invention.
Figure 7:
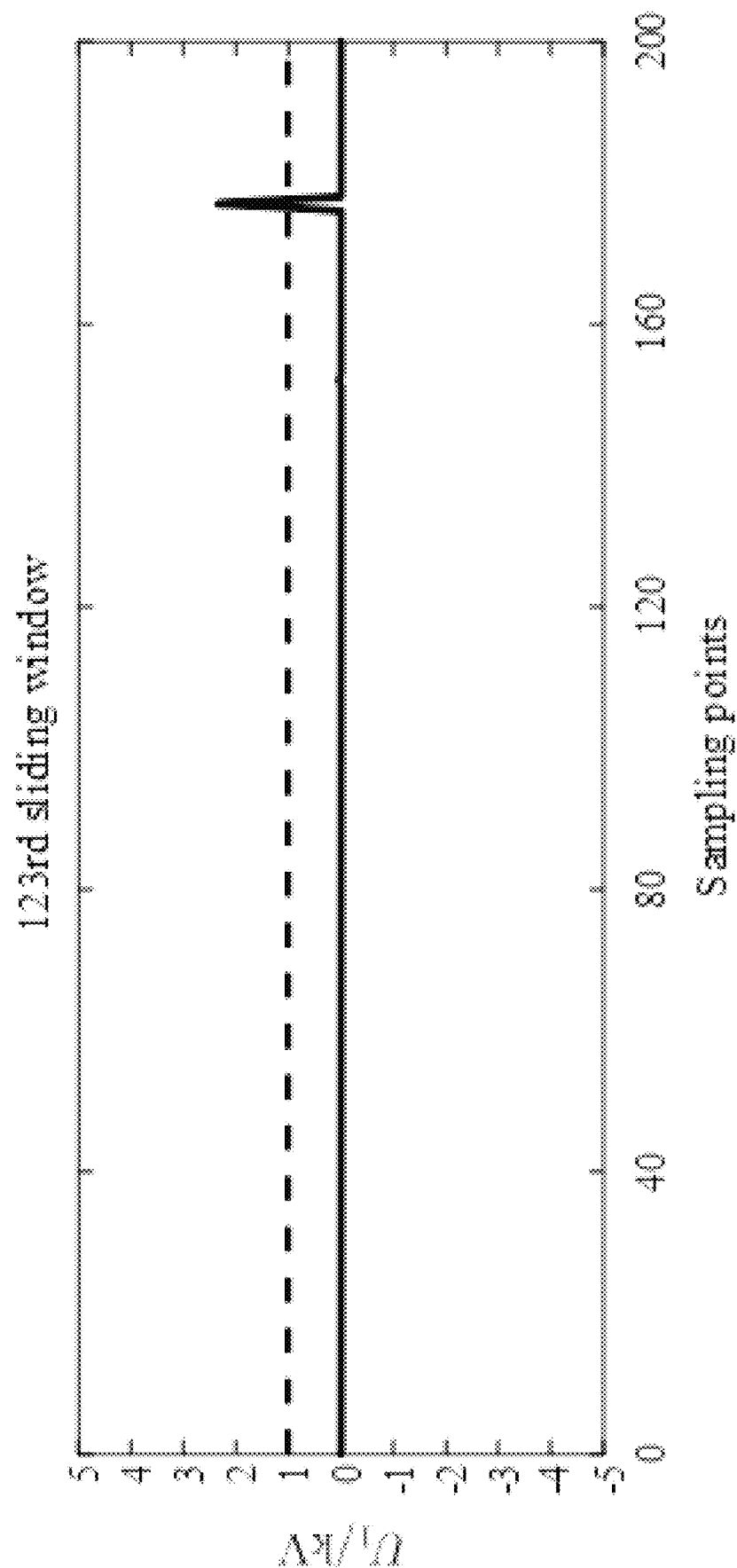
FIG. 7 is a schematic diagram of the 123-rd sliding window for fault nature identification in example 1 of this invention.

Step5: Within the maximum discrimination time limit $t_{max}$, use each sliding time window $T_{s2}$ for fault nature identification. If judged as a permanent fault, lock out the reclosing device; if judged as a transient fault, proceed to Step 6. In this example, as shown in FIG. 6, there is no significant mutation in the first sliding window, until a significant mutation is detected at the 182-nd sampling point in the 123-rd sliding window, as shown in FIG. 7, and it is judged as a transient fault.

Step6: Calculate the fault disappearance time $t_d$, and determine the reclosing time $t_c$ through the fault disappearance time.

Step6.1: Calculate the fault disappearance time $t_d$ based on the sliding number i and the mutation sampling point m of the sampling time window $T_{s2}$ obtained in Step 4.2.

$$T_c = 1/f_s = 1/20000 = 5 \times 10^{-5} s = 0.05 \text{ ms}$$

$$t_d = m \cdot T_c + i + t_o + 30 = 182 \times 0.05 + 122 + 95.55 + 30 = 256.65 \text{ ms}$$

This means that the fault disappears 256.65 ms after the fault occurs, with only a 6.65 ms error compared to the actual fault disappearance time of 250 ms.

Step6.2: Use the obtained fault disappearance time $t_d$, combined with the arc channel insulation recovery time to determine the reclosing time $t_c$, and output the closing signal.

$$t_c = t_d + 100 = 256.65 + 100 = 256.65 \text{ ms}$$

This means that the closing signal is output 356.65 ms after the fault occurs, and the circuit breaker at both ends of the wind power AC transmission line protection installation recloses.

Figure 3:
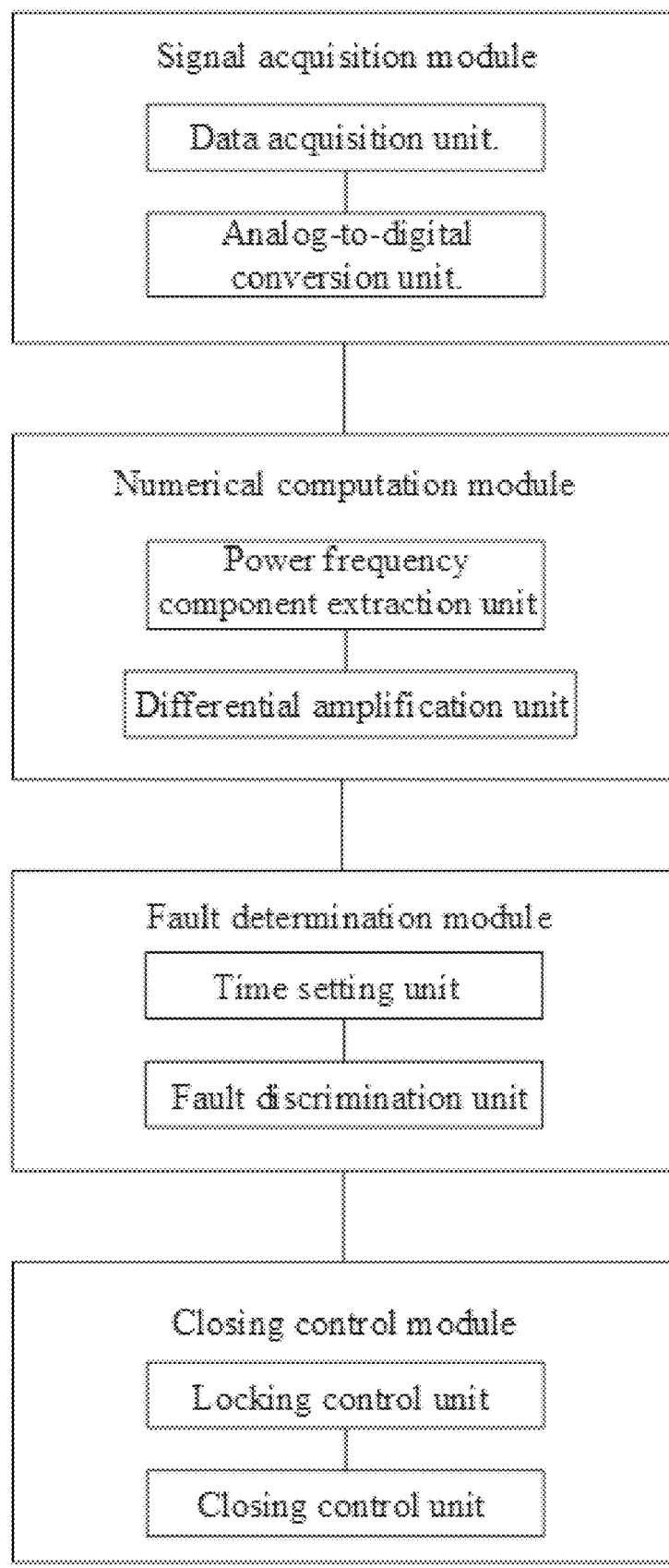
FIG. 3 is a block diagram of the adaptive reclosing system of this invention.

FIG. 3 is a functional block diagram of the adaptive single-phase auto-reclosing system for wind power AC transmission lines provided by this invention, which includes:

A signal acquisition module, used to obtain voltage data of the fault phase at the protection installation on the wind farm side after a fault occurs;

A numerical calculation module, used to subject the obtained fault phase voltage data to short-time Fourier transform, extract the fundamental frequency amplitude voltage component amplitude, and perform differential amplification processing;

A fault judgment module, used to construct a fault nature identification criterion, combine with a sliding time window to determine the fault nature within the maximum discrimination time limit, and output the determination result;

A closing control module, used to receive the output signal from the fault judgment module and control the circuit breaker to take corresponding actions according to the signal.

The signal acquisition module specifically includes:

A data acquisition unit: used to collect analog voltage quantities of the fault phase at the protection installation on the wind farm side. In this example, the sampling frequency is 20 kHz;

An analog-to-digital conversion unit: used to convert the obtained voltage analog quantity into a digital quantity.

The numerical calculation module specifically includes:

A fundamental frequency quantity extraction unit: used to subject the obtained fault phase voltage data to short-time Fourier transform and extract the fundamental frequency amplitude voltage component amplitude;

A differential amplification unit: used to perform differential amplification processing on the obtained fundamental frequency voltage component amplitude. In this example, three times differential transformation is sampled.

The fault judgment module specifically includes:

A time limit setting unit: used to set the maximum discrimination time limit and determine the sampling window length. In this example, the maximum discrimination time limit is 470 ms, the sampling time window $T_{s1}$ is 20 ms, and the sampling time window $T_{s2}$ is 10 ms;

A fault discrimination unit: used to construct a fault nature identification criterion, combine with a sliding time window to determine the fault nature within the maximum discrimination time limit, if judged as a permanent fault, output a lockout signal; if judged as a transient fault, output a closing signal. In this example, a significant mutation is judged at the 182-nd sampling point in the 123-rd sliding window, the fault duration is 256.65 ms, and the closing signal is output at 356.65 ms after the fault occurs.

The closing control module specifically includes:

A lockout control unit: used to receive the circuit breaker lockout signal and control the circuit breaker not to act;

A closing control unit: used to receive the circuit breaker closing signal, after a fixed deionization time, control the circuit breaker to reclose.

Example 2: The wind power AC transmission line simulation model system is shown in FIG. 1. There are no shunt reactors installed on both sides of the AC transmission line, the line length is 100 km, and the voltage level is 220 kV. A fault is set to occur 30 km away from the wind farm, the fault type is a single-phase ground permanent fault on phase A. The circuit breaker trips after 95.55 ms from the fault occurrence, the fault duration is infinite, the transition resistance is 200Ω, and the sampling rate is 20 kHz.

Figure 8:
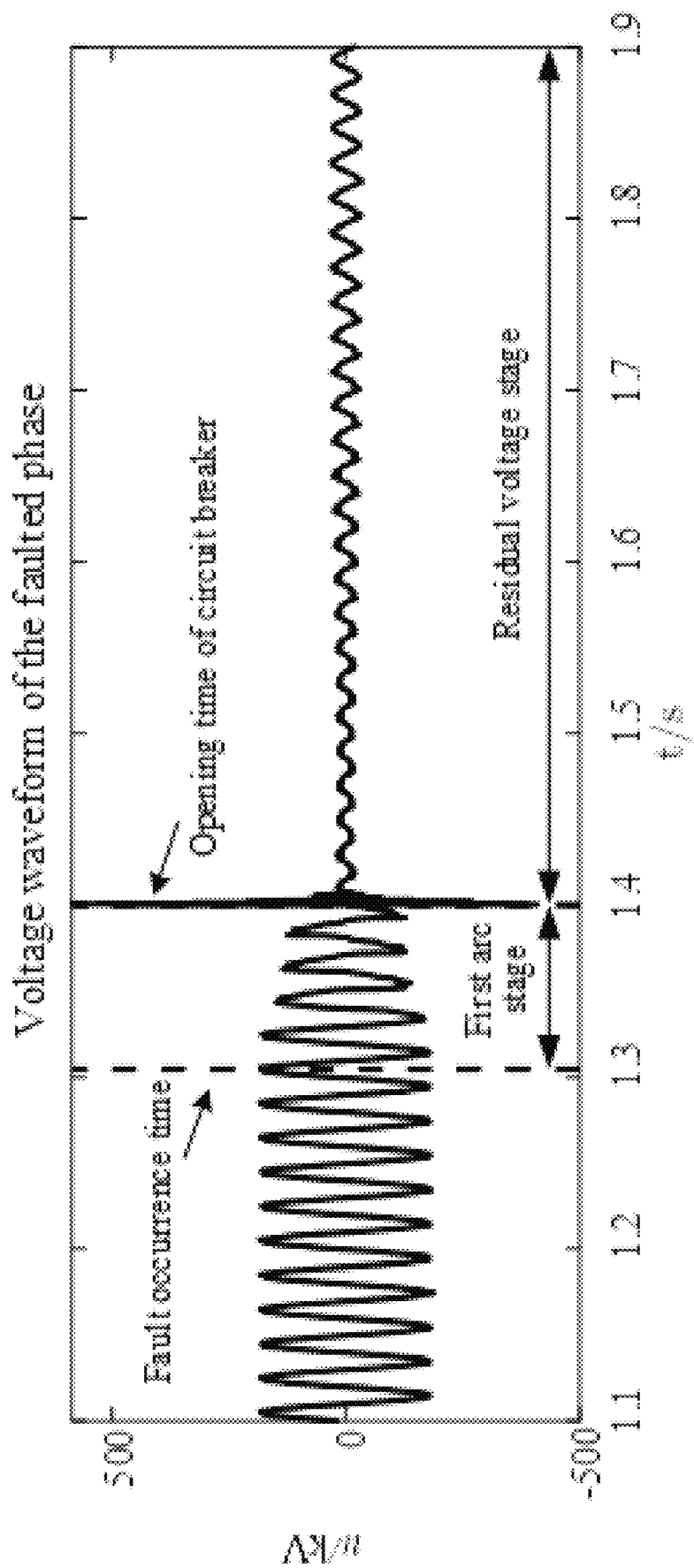
FIG. 8 is a waveform diagram of the fault phase voltage in example 2 of this invention.

An adaptive single-phase auto-reclosing method for wind power AC transmission lines includes the following steps:

Step1: Sample the fault phase voltage using a signal acquisition device;

Step1.1: Install a voltage signal acquisition device on the wind farm side of the outgoing line;

Step1.2: After a single-phase ground fault occurs in the wind farm outgoing line, use the signal acquisition device to sample the fault phase voltage, as shown in FIG. 8.

Figure 9:
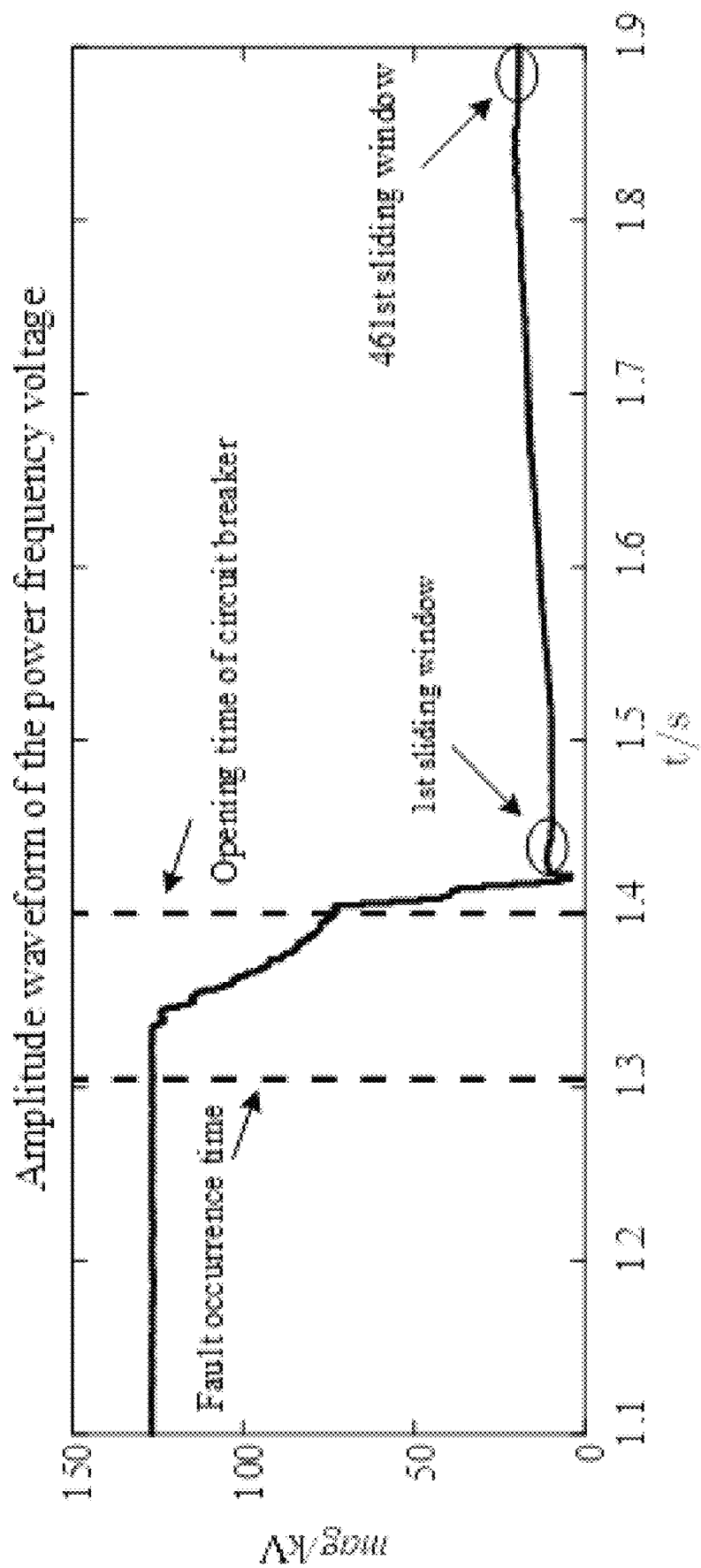
FIG. 9 is a waveform diagram of the fundamental frequency voltage component amplitude of the fault phase in example 2 of this invention.

Step2: Subject the obtained fault phase voltage to short-time Fourier transform to extract the fundamental frequency voltage component amplitude $U_f(k)$;

Step2.1: Define a sliding time window $T_{s1}$ with a sampling window length and a sliding factor both of 20 ms;

Step2.2: Subject the collected fault phase voltage to short-time Fourier transform within each sliding time window $T_{s1}$ to extract the fundamental frequency voltage component amplitude $U_f(k)$, where k represents the current sampling point, as shown in FIG. 9.

Step3: Subject the obtained fundamental frequency voltage component amplitude of the fault phase to differential amplification processing to obtain $U_d(k)$;

Step3.1: Define a sliding time window $T_{s2}$ with a sampling window length of a and a sliding factor of b. In this example, a is set to 10 ms and b is set to 1 ms.

Step3.2: In each sliding time window $T_{s2}$, the amplitude of the power frequency voltage component $U_f(k)$ is differentially amplified j times.

$$U_{di}(k) = [U_{fi}(k+1) - U_{fi}(k)]^j, k = 1, 2, \ldots, N$$

where i represents the i-th sliding time window $T_{s2}$, and N represents the number of sampling points contained in a sampling time window. In this embodiment, j takes 3 and N takes 200.

Step4: Calculate the maximum discrimination time limit and construct a fault nature identification criterion;

Step4.1: Set the maximum discrimination time limit $t_{max}$ to 470 ms. In this example, the sliding time window $T_{s2}$ is 10 ms and the sliding factor is 1 ms. According to the maximum discrimination time limit, the maximum number of sliding times i is calculated to be 461.

Step4.2: Construct a fault nature identification criterion: if within a certain time window Udi(m)>1, then it is judged as a transient fault, otherwise it is judged as a permanent fault.

Figure 10:
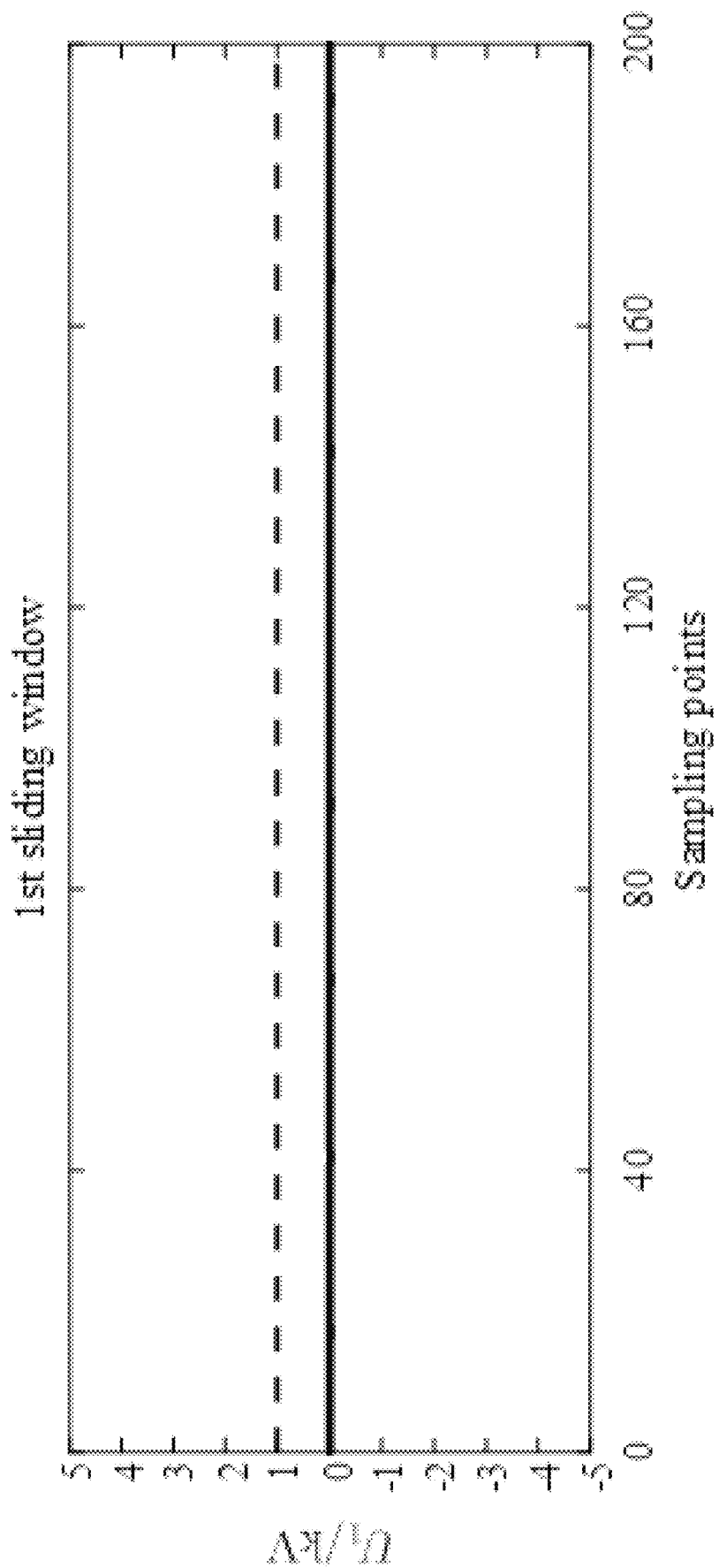
FIG. 10 is a schematic diagram of the first sliding window for fault nature identification in example 2 of this invention.
Figure 11:
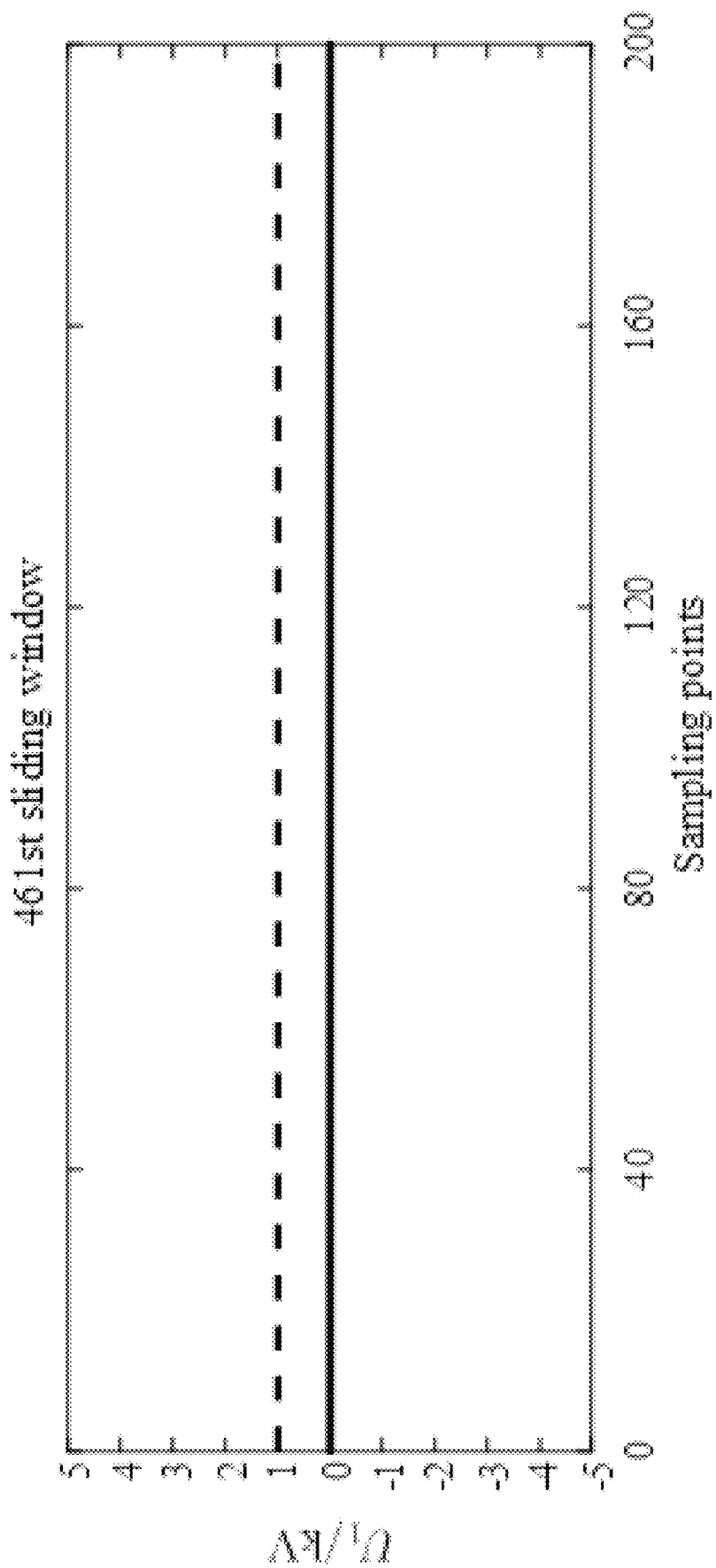
FIG. 11 is a schematic diagram of the 461-st sliding window for fault nature identification in example 2 of this invention.

Step5: Within the maximum discrimination time limit $t_{max}$, use each sliding time window $T_{s2}$ for fault nature identification. If judged as a permanent fault, lock out the reclosing device; if judged as a transient fault, proceed to Step 6. In this example, as shown in FIGS. 10 and 11, no significant mutation is detected from the first sliding window to the 461-st sliding window, hence it is judged as a permanent fault and a lockout signal is output.

FIG. 3 is a functional block diagram of the adaptive single-phase auto-reclosing system for wind power AC transmission lines provided by this invention, which includes:

A signal acquisition module, used to obtain voltage data of the fault phase at the protection installation on the wind farm side after a fault occurs;

A numerical calculation module, used to subject the obtained fault phase voltage data to short-time Fourier transform, extract the fundamental frequency amplitude voltage component amplitude, and perform differential amplification processing;

A fault judgment module, used to construct a fault nature identification criterion, combine with a sliding time window to determine the fault nature within the maximum discrimination time limit, and output the determination result;

A closing control module, used to receive the output signal from the fault judgment module and control the circuit breaker to take corresponding actions according to the signal.

The signal acquisition module specifically includes:

A data acquisition unit: used to collect analog voltage quantities of the fault phase at the protection installation on the wind farm side. In this example, the sampling frequency is 20 kHz;

An analog-to-digital conversion unit: used to convert the obtained voltage analog quantity into a digital quantity.

The numerical calculation module specifically includes:

A fundamental frequency quantity extraction unit: used to subject the obtained fault phase voltage data to short-time Fourier transform and extract the fundamental frequency amplitude voltage component amplitude;

A differential amplification unit: used to perform differential amplification processing on the obtained fundamental frequency voltage component amplitude. In this example, three times differential transformation is sampled.

The fault judgment module specifically includes:

A time limit setting unit: used to set the maximum discrimination time limit and determine the sampling window length. In this example, the maximum discrimination time limit is 470 ms, the sampling time window Ts1 is 20 ms, and the sampling time window Ts2 is 10 ms;

Fault discrimination unit: used for constructing fault nature identification criteria, combining with the sliding time window to determine the fault nature within the maximum discrimination time limit, if it is judged to be a permanent fault, output a blocking signal; If it is judged to be a transient fault, the closing signal is output. In the present embodiment, no obvious mutation is detected from the first sliding window to the 461-st sampling point, which is judged to be a permanent fault, and a blocking signal is output.

The closing control module specifically includes:

A lockout control unit: used to receive the circuit breaker lockout signal and control the circuit breaker not to act;

A closing control unit: used to receive the circuit breaker closing signal, after a fixed deionization time, control the circuit breaker to reclose.

Compared with the traditional automatic reclosing method of wind power AC transmission lines, the adaptive reclosing of this invention scheme can accurately judge the nature of the fault. When judged as a permanent fault, output a lockout signal to avoid secondary impact on the system; when judged as a transient fault, calculate the fault disappearance time and set a reasonable reclosing time to quickly restore system power supply, greatly improving the reliability of system power supply.

The above combines the drawings to make a detailed description of the specific implementation of this invention, but this invention is not limited to the above implementation. Within the knowledge range of ordinary technicians in this field, various changes can be made without departing from the purpose of this invention.

What is claimed is:

1. A single-phase adaptive reclosing method for an AC transmission line of a wind farm, where no parallel reactor is installed on either side of the AC transmission line, the single-phase adaptive reclosing method comprising:

sampling a fault phase voltage using a signal acquisition device;

subjecting the sampled fault phase voltage to short-time Fourier transform to extract a fundamental frequency voltage component amplitude $U_f(k)$;

subjecting the extracted fundamental frequency voltage component amplitude of the fault phase voltage to differential amplification processing to obtain $U_d(k)$;

setting a maximum discrimination time limit $t_{max}$ and constructing a fault nature identification criterion, wherein:

the fault nature is judged as the transient fault if within a certain time window $U_{di}(m) > \varepsilon$, $\varepsilon$ being a set threshold, otherwise the fault nature is judged as a permanent fault; and performing a fault nature identification using the fault nature identification criterion wherein:

if the fault nature is identified as a permanent fault, locking out the reclosing device; and if the fault nature is identified as a transient fault, Calculate a fault disappearance time $t_d$, and determine a reclosing time $t_c$ through the fault disappearance time, and perform reclosing at time $t_c$, wherein, calculating the fault disappearance time $t_d$, and determining the reclosing time $t_c$ through the fault disappearance time, and performing reclosing at time $t_c$ comprises:

calculating the fault disappearance time $t_d$ according to sliding times i of a sampling time window $T_{s2}$ obtained by constructing the fault nature identification criterion and a mutation sampling point m as follows:

$$t_d = m \cdot T_c + i + t_o + 30$$

where $T_c$ is the interval between two adjacent sampling points, and is calculated as follows:

$$T_c = \frac{1}{f_s}$$

where $f_s$ is the signal sampling frequency; and using the calculated fault disappearance time $t_d$, combined with an arc channel insulation recovery time t to determine the reclosing time $t_c$, and output a closing signal wherein the reclosing time $t_c$ is determined as follows:

$$t_c = t_d + t.$$

2. The method of claim 1, wherein sampling the fault phase voltage specifically includes:

installing a voltage signal acquisition device on a wind farm side of the transmission line; and using the signal acquisition device to sample the voltage of the fault phase after a single-phase grounding fault occurs in the wind farm transmission line.

3. The method of claim 1, wherein subjecting the sampled fault phase voltage to short-time Fourier transform to extract the fundamental frequency voltage component amplitude $U_f(k)$ specifically includes:

defining a sliding time window $T_{s1}$ with a sampling window length and a sliding factor both equal to 20 ms; and performing short-time Fourier transform on the sampled fault phase voltage within each sliding time window $T_{s1}$ to extract the amplitude of the fundamental frequency voltage component $U_f(k)$.

4. The method of claim 1, wherein subjecting the extracted fundamental frequency voltage component amplitude of the fault phase voltage to differential amplification processing to obtain $U_d(k)$ specifically includes:

defining sliding time of the sampling time window $T_{s2}$ with a sampling window length of a and a sliding factor of b; and performing j times differential amplification processing on the fundamental frequency voltage component amplitude $U_f(k)$ within each sliding time of the sampling time window $T_{s2}$:

$$U_{di}(k) = [U_{fi}(k+1) - U_{fi}(k)]^j, k = 1, 2, \ldots, N$$

where i represents an i-th sliding time of the sampling time window $T_{s2}$, and N represents number of sampling points contained in a sampling time window.

5. A system for implementing the single-phase adaptive reclosing method for the AC transmission line of a wind farm as described in claim 1, wherein the system comprises:

a signal acquisition module, used to obtain voltage data of the fault phase at a protection installation on a wind farm side after a fault occurs;

a numerical calculation module, used to perform short-time Fourier transform on the obtained fault phase voltage data, extract the fundamental frequency voltage component amplitude $U_f(k)$, and perform differential amplification processing;

a fault judgment module, used to construct the fault nature identification criterion, combine a sliding time window to determine the fault nature within the maximum discrimination time limit, and output a determination result; and a closing control module, used to receive the output from the fault judgment module and control a circuit breaker to take corresponding actions.

6. The system of claim 5, wherein the signal acquisition module specifically includes:

a data acquisition unit: used to collect analog voltage quantities of the fault phase at the protection installation on the wind farm side; and an analog-to-digital conversion unit: used to convert the collected analog voltage quantity into a digital quantity.

7. The system of claim 5, wherein the fault judgment module specifically includes:

a time limit setting unit: used to set the maximum discrimination time limit and determine a sampling window length; and a fault discrimination unit: used to construct a fault nature identification criterion, combine the sliding time window to determine the fault nature within the maximum discrimination time limit, wherein:

if judged as a permanent fault, the fault discrimination unit is configured to output a lockout signal; and if judged as the transient fault, the fault discrimination unit is configured to output the closing signal.

8. The system of claim 5, wherein the closing control module specifically includes:
   a lockout control unit: used to receive a circuit breaker lockout signal and control the circuit breaker not to act; and
   a closing control unit: used to receive a circuit breaker closing signal, after a fixed deionization time, control the circuit breaker to reclose.

* * * * *